(12) United States Patent
Huang et al.

(10) Patent No.: US 12,317,568 B2
(45) Date of Patent: May 27, 2025

(54) SEMICONDUCTOR STRUCTURE INCLUDING SOURCE/DRAIN REGIONS AT DIFFERENT LEVELS WITHIN SEMICONDUCTOR LAYER AND METHOD OF MANUFACTURE

(71) Applicant: Taiwan Semiconductor Manufacturing Company Limited, Hsin-Chu (TW)

(72) Inventors: Yong-Sheng Huang, Hsin-Chu (TW); Ming Chyi Liu, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 428 days.

(21) Appl. No.: 17/846,150

(22) Filed: Jun. 22, 2022

(65) Prior Publication Data
US 2023/0420554 A1    Dec. 28, 2023

(51) Int. Cl.
| H01L 29/417 | (2006.01) |
| H10D 30/64 | (2025.01) |
| H10D 62/13 | (2025.01) |
| H10D 64/00 | (2025.01) |
| H10D 64/01 | (2025.01) |
| H10D 64/23 | (2025.01) |
| H10D 84/01 | (2025.01) |
| H10D 84/03 | (2025.01) |

(52) U.S. Cl.
CPC .......... *H10D 64/256* (2025.01); *H10D 30/64* (2025.01); *H10D 62/152* (2025.01); *H10D 64/017* (2025.01); *H10D 64/111* (2025.01); *H10D 64/251* (2025.01); *H10D 84/013* (2025.01); *H10D 84/017* (2025.01); *H10D 84/038* (2025.01)

(58) Field of Classification Search
CPC ..... H01L 21/823418; H01L 21/823487; H01L 21/823814; H01L 21/823885; H01L 29/0843; H01L 29/0852; H01L 29/0856; H01L 29/0873; H01L 29/402; H01L 29/41725; H01L 29/41766; H01L 29/66545; H01L 29/66659; H01L 29/7801; H01L 29/7834; H01L 29/7835; H10D 64/251; H10D 64/252; H10D 64/2527; H10D 64/254; H10D 64/256; H10D 64/257; H10D 84/01; H10D 84/013; H10D 84/017; H10D 84/038
See application file for complete search history.

(56) References Cited

U.S. PATENT DOCUMENTS

2004/0183124 A1*   9/2004   Hsu .................. H01L 29/7881
257/E29.302

* cited by examiner

*Primary Examiner* — Cheung Lee
(74) *Attorney, Agent, or Firm* — Cooper Legal Group, LLC

(57) ABSTRACT

A semiconductor structure and method of manufacture is provided. In some embodiments, a semiconductor structure includes a semiconductor layer comprising a first uppermost surface, a lowermost surface, and a first sidewall surface extending between the uppermost surface and the lowermost surface. A gate dielectric layer is over the semiconductor layer. A first gate electrode is over a portion of the gate dielectric layer over the uppermost surface of the semiconductor layer. A first source/drain region is in the semiconductor layer under the first uppermost surface and adjacent the first gate electrode. A second source/drain region is in the semiconductor layer under the lowermost surface of the semiconductor layer.

20 Claims, 6 Drawing Sheets

SEMICONDUCTOR STRUCTURE INCLUDING SOURCE/DRAIN REGIONS AT DIFFERENT LEVELS WITHIN SEMICONDUCTOR LAYER AND METHOD OF MANUFACTURE

BACKGROUND

Semiconductor structures are used in a multitude of electronic devices, such as consumer products, industrial electronics, appliances, aerospace devices, and transportation devices. Some semiconductor structures include metal-oxide-semiconductor field-effect transistors (MOSFETs). One type of MOSFET is a double diffused MOS (DMOS). In comparison with other MOSFETs, the DMOS is capable of delivering more current per unit area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
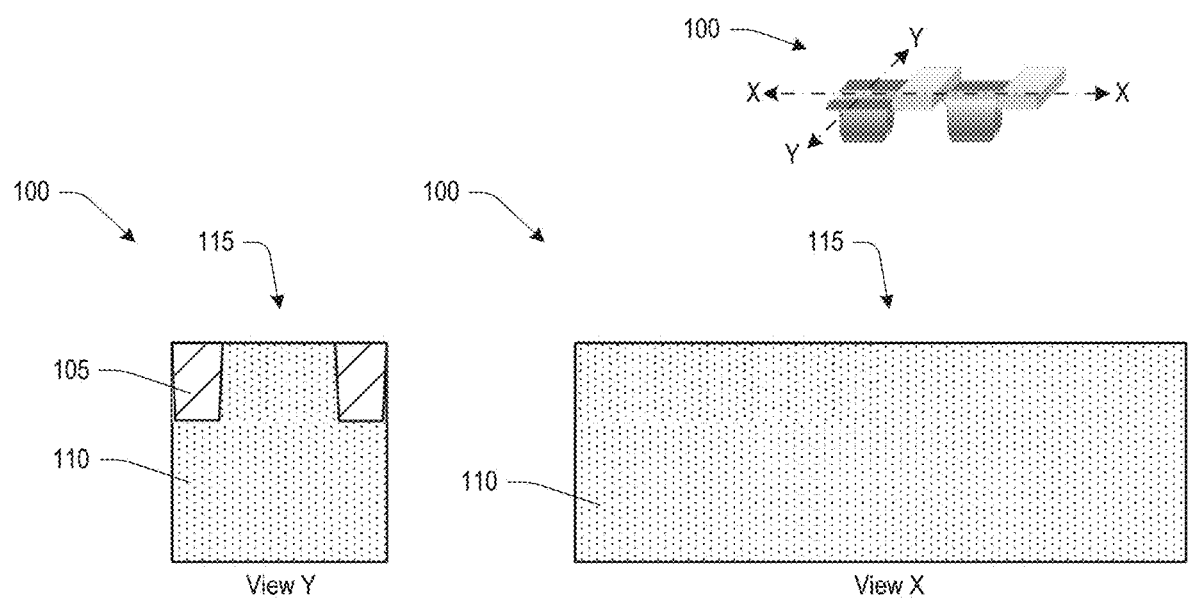
FIGS. 1-11 are illustrations of a semiconductor structure at various stages of fabrication, in accordance with some embodiments.

The following disclosure provides many different embodiments, or examples, for implementing different features of the provided subject matter. Specific examples of components and structures are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present application relates to a semiconductor structure and a method for fabricating a semiconductor structure. In accordance with some embodiments, a semiconductor structure is formed by forming a recess in a semiconductor layer. A device, such as a DMOS device is formed by forming a first source/drain region in the semiconductor layer and forming a gate structure adjacent the first source/drain region outside the trench and forming a second source/drain region in the recess. For example, the first source/drain region is a source region, and the first source/drain region is a drain region. The path between the first source/drain region and the second source/drain region extends along the uppermost surface of the semiconductor layer, along a sidewall surface of the semiconductor layer in the recess, and along a lowermost surface of the semiconductor layer in the bottom of the recess. Since a portion of the path between the first source/drain region and the second source/drain region is along a substantially vertical portion, the length of the path is increased without increasing a lateral footprint of the device. In some embodiments, a first dielectric layer is formed in the recess and a contact field plate is formed over the first dielectric layer. A second dielectric layer is formed over the first gate structure and in the recess over the contact field plate. Conductive structures are formed in the second dielectric layer to contact the first source/drain region, the second source/drain region, and the conductive field plate. Source/drain region(s) may refer to a source or a drain, individually or collectively dependent upon the context.

In some embodiments, a second device may be formed by forming a third source/drain region and gate structure in and over the uppermost surface of the semiconductor layer on the other side of the recess. The second source/drain region may be shared by the devices. The path between the third source/drain region and the second source/drain region also includes a substantially vertical portion, thereby reducing the overall lateral footprint of the pair of devices.

FIGS. 1-10 illustrate a semiconductor structure 100 at various stages of fabrication, in accordance with some embodiments. FIGS. 1-10 include a simplistic plan view showing where various cross-sectional views are taken. Referring to FIG. 1, the view X-X is a cross-sectional view taken through the semiconductor structure 100 in a direction corresponding to a gate length direction and the view Y-Y is a cross-sectional view taken through the semiconductor structure 100 in a direction corresponding to a gate length width direction. Not all aspects of the processing shown in the cross-sectional views will be depicted in the plan view.

Referring to FIG. 1, a shallow trench isolation (STI) structure 105 is formed in a semiconductor layer 110 is formed over a portion of the semiconductor layer 110, in accordance with some embodiments. An active region 115 is bounded by the STI structure 105. For example, the STI structure 105 may surround the active region 115 to electrically isolate the active region 115 from other regions, such as regions where other types of devices are formed. In some embodiments, the semiconductor layer 110 is part of a substrate comprising at least one of an epitaxial layer, a single crystalline semiconductor material such as, but not limited to, at least one of Si, Ge, SiGe, InGaAs, GaAs, InSb, GaP, GaSb, InAlAs, GaSbP, GaAsSb, or InP, a silicon-on-insulator (SOI) structure, a wafer, or a die formed from a wafer. In some embodiments, the semiconductor layer 110 comprises at least one of crystalline silicon or other suitable materials. Other structures and/or configurations of the semiconductor layer 110 are within the scope of the present disclosure.

In some embodiments, the STI structure 105 is formed by forming at least one mask layer over the semiconductor layer 110. In some embodiments, the at least one mask layer comprises a layer of oxide material over the semiconductor layer 110 and a layer of nitride material over the layer of oxide material, and/or one or more other suitable layers. At least one of the at least one mask layer is removed to form an etch mask for use as a template to etch the semiconductor layer 110 to form a trench. A dielectric material is formed in the trench to form the STI structure 105. In some embodiments, the STI structure 105 includes multiple layers, such as an oxide liner, a nitride liner formed over the oxide liner, an oxide fill material formed over the nitride liner, and/or other suitable materials.

In some embodiments, a fill material is formed using a high density (HDP) plasma process. The HDP process uses precursor gases comprising at least one of silane ($SiH_4$), oxygen, argon, or other suitable gases. The HDP process includes a deposition component, which forms material on surfaces defining the trench, and a sputtering component, which removes or relocates deposited material. A deposition-to-sputtering ratio depends on gas ratios employed during the deposition. In accordance with some embodiments, argon and oxygen act as sputtering sources, and the particular values of the gas ratios are determined based on an aspect ratio of the trench. After forming the fill material, an anneal process is performed to densify the fill material. In some embodiments, the STI structure 105 generates compressive stress that serves to compress the active region 115. Other structures and/or configurations of the STI structure 105 are within the scope of the present disclosure.

Although the semiconductor layer 110 and the STI structure 105 are illustrated as having coplanar upper surfaces at an interface where the semiconductor layer 110 abuts the STI structure 105, the relative heights can vary. For example, the STI structure 105 can be recessed relative to the semiconductor layer 110, or the semiconductor layer 110 can be recessed relative to the STI structure 105. The relative heights at the interface depend on the processes performed for forming the STI structure 105, such as at least one of deposition, planarization, mask removal, surface treatment, or other suitable techniques.

Figure 2:
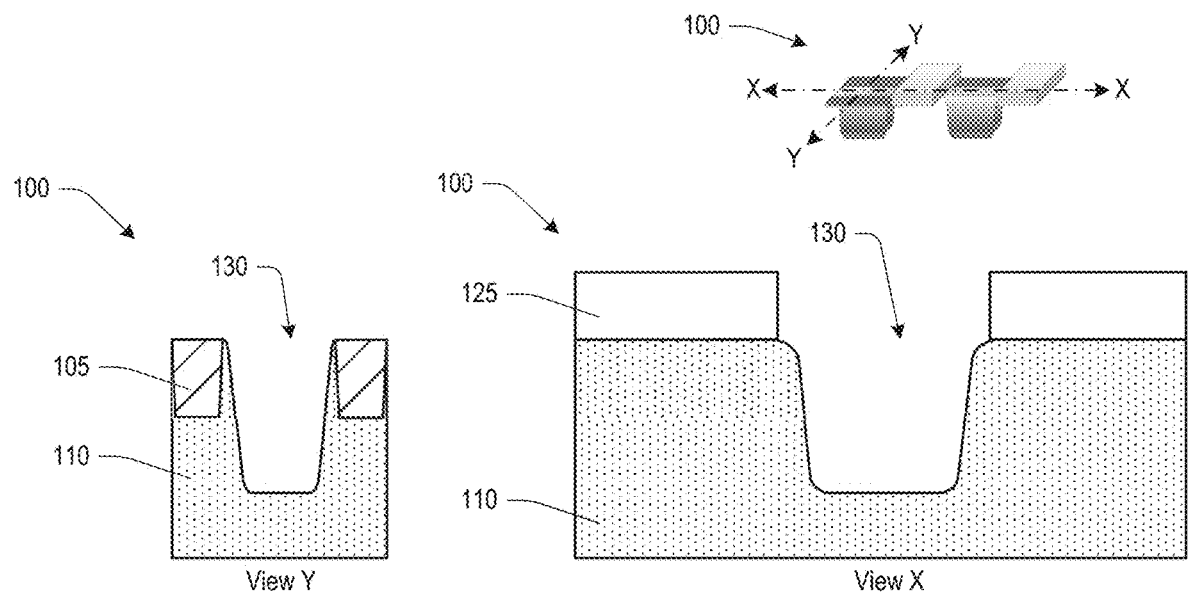

Referring to FIG. 2, a mask 125 is formed over the semiconductor layer 110 and a recess 130 is formed in the semiconductor layer 110 using the mask 125 as a removal template, in accordance with some embodiments. In accordance with some embodiments, the mask 125 comprises a plurality of individually formed layers that together form a mask stack. In some embodiments, the mask 125 comprises at least one of a hard mask layer, a bottom antireflective coating (BARC) layer, an organic planarization layer (OPL), or a photoresist layer. The hard mask layer is formed by at least one of physical vapor deposition (PVD) (e.g., sputtering and/or evaporation), chemical vapor deposition (CVD) (e.g., low pressure CVD (LPCVD), ultrahigh vacuum CVD (UHVCVD), reduced pressure CVD (RPCVD), plasma-enhanced CVD (PECVD), and/or atmospheric pressure CVD (APCVD)), spin on, growth, or other suitable techniques. In some embodiments, the hard mask layer comprises at least one of silicon and oxygen, silicon and nitrogen, nitrogen, silicon (e.g., polycrystalline silicon), or other suitable materials. In some embodiments, the BARC layer is a polymer layer that is applied using a spin coating process. In some embodiments, the OPL comprises a photo-sensitive organic polymer that is applied using a spin coating process. In some embodiments, the OPL comprises a dielectric layer. In some embodiments, the photoresist layer is formed by at least one of spinning, spray coating, or other suitable techniques. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist. One or more etchants have a selectivity such that the one or more etchants remove or etch away one or more layers exposed or not covered by the photoresist at a greater rate than the one or more etchants remove or etch away the photoresist. Accordingly, an opening in the photoresist allows the one or more etchants to form a corresponding opening in the one or more layers under the photoresist, and thereby transfer a pattern in the photoresist to the one or more layers under the photoresist. The photoresist is stripped or washed away after the pattern transfer. The layers of the mask stack are patterned to form the mask 125. In some embodiments, the photoresist layer is exposed using a radiation source and a reticle to define a pattern in the photoresist layer, and portions of the photoresist layer are removed to define a patterned photoresist layer. The underlying OPL, BARC layer, and hard mask layer are etched using the patterned photoresist layer as a template to form the mask 125 and expose portions of the semiconductor layer 110 under the mask 125. Other structures and configurations of the mask 125 within the scope of the present disclosure.

In some embodiments, the recess 130 is formed in the semiconductor layer 110 by performing an etching processes to remove portions of the semiconductor layer 110 exposed by the mask 125. The etching process comprises at least one of a plasma etching process, a reactive ion etching (RIE) process, or other suitable techniques. In some embodiments, the recess 130 is a trench. Other structures and configurations of the recess 130 are within the scope of the present disclosure.

Figure 3:
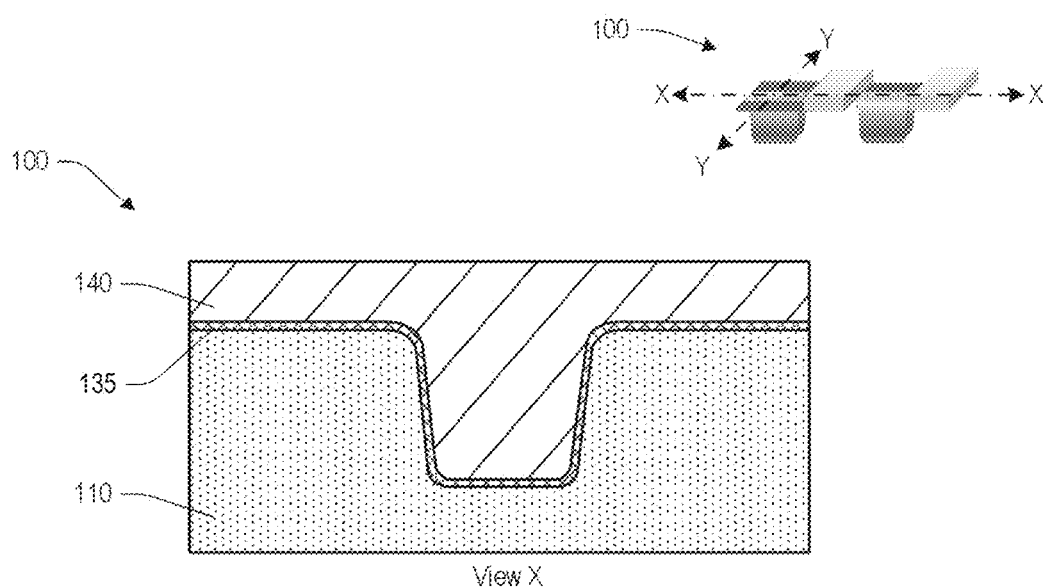

Referring to FIG. 3, a gate dielectric layer 135 and a gate electrode layer 140 are formed over the semiconductor layer 110 and in the recess 130, in accordance with some embodiments. In accordance with some embodiments, In some embodiments, the gate dielectric layer 135 and the gate electrode layer 140 are formed by forming a layer of gate dielectric material, forming a layer of gate electrode material over the layer of gate dielectric material and per forming an etch back process to planarize the gate electrode layer 140.

In some embodiments, the gate dielectric layer 135 comprises silicon dioxide, a high-k dielectric, or some other suitable gate dielectric layer material. As used herein, the term "high-k dielectric" refers to the material having a dielectric constant, k, greater than or equal to about 3.9, which is the k value of $SiO_2$. The high-k dielectric material may comprise any suitable materials. Examples of the high-k dielectric material include, but are not limited to, $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, an alloy thereof, and/or other suitable materials. Each value of x is independently from 0.5 to 3, and each value of y is independently from 0 to 2. In some embodiments, the gate dielectric layer 135 comprises a native oxide layer formed by exposure of the semiconductor structure 100 to oxygen at various points in the process flow, causing the formation of silicon dioxide on exposed surfaces. In some embodiments, an additional layer of dielectric material, such as comprising silicon dioxide, a high-k dielectric material, and/or other suitable materials, is formed over the native oxide to form the gate dielectric layer 135.

In some embodiments, the gate electrode layer 140 comprises polysilicon, metal, or some other suitable gate electrode material. In some embodiments, the initial layer of gate dielectric material and the initial layer of gate electrode material are sacrificial layers, and the sacrificial gate dielectric layer is later replaced with a replacement gate dielectric layer and the sacrificial layer of gate electrode material is replaced with a replacement gate electrode. A metal gate electrode layer may comprise a barrier layer, one or more work function material layers, a seed layer, a metal fill layer, and/or other suitable layers. In some embodiments, the metal fill layer comprises tungsten, aluminum, copper, cobalt, and/or other suitable materials. In some embodiments, the gate dielectric layer 135 and/or the one or more layers that comprise the gate electrode layer 140 are formed by at least one of atomic layer deposition (ALD), physical vapor deposition (PVD), chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), plating, or other suitable techniques.

Figure 4:
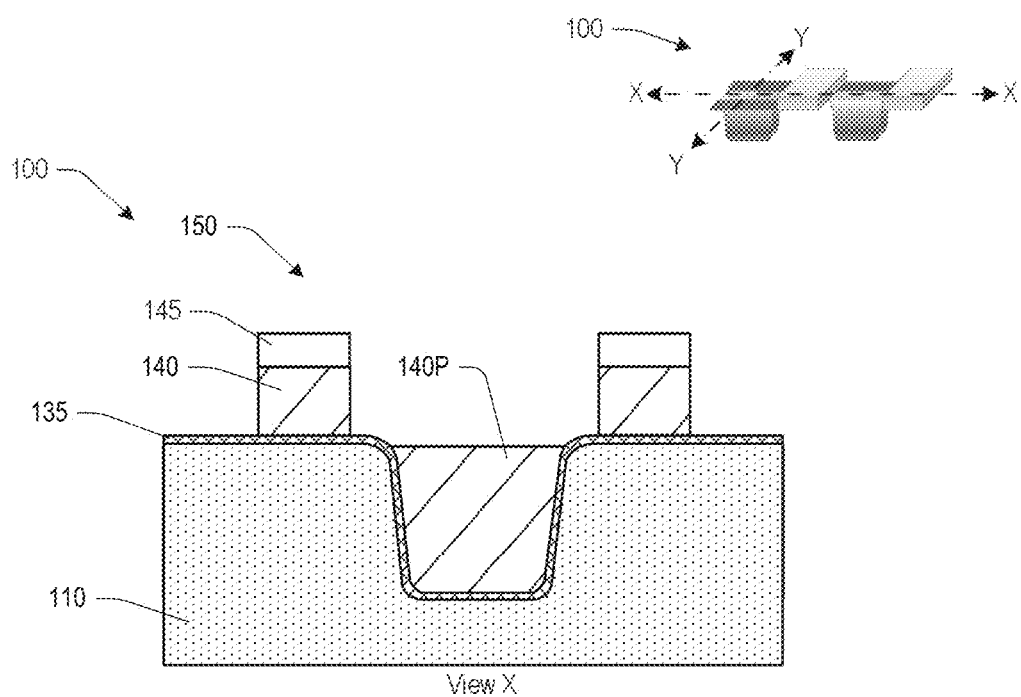

Referring to FIG. 4, a gate mask 145 is formed over the gate electrode layer 140 and a patterning process is performed to form gate structures 150 including the gate dielectric layer 135 and the gate electrode layer 140, in accordance with some embodiments. In some embodiments, the gate mask 145 is formed using at least one of a hard mask layer, a BARC layer, an OPL, or a photoresist layer comprising materials and formed as described herein. An etching processes is performed using the gate mask 145 as an etch template to pattern the gate electrode layer 140 and gate dielectric layer 135 to form the gate structures 150. In some embodiments, the etching process is at least one of a plasma etching process, a reactive ion etching (RIE) process, or other suitable techniques. In some embodiments, the gate mask 145 remains over the gate electrode layer 140 and functions as a cap layer. Other configurations of the gate structures 150 are within the scope of the present disclosure. A portion 140P of the gate electrode layer 140 remains in the recess 130.

Figure 5:
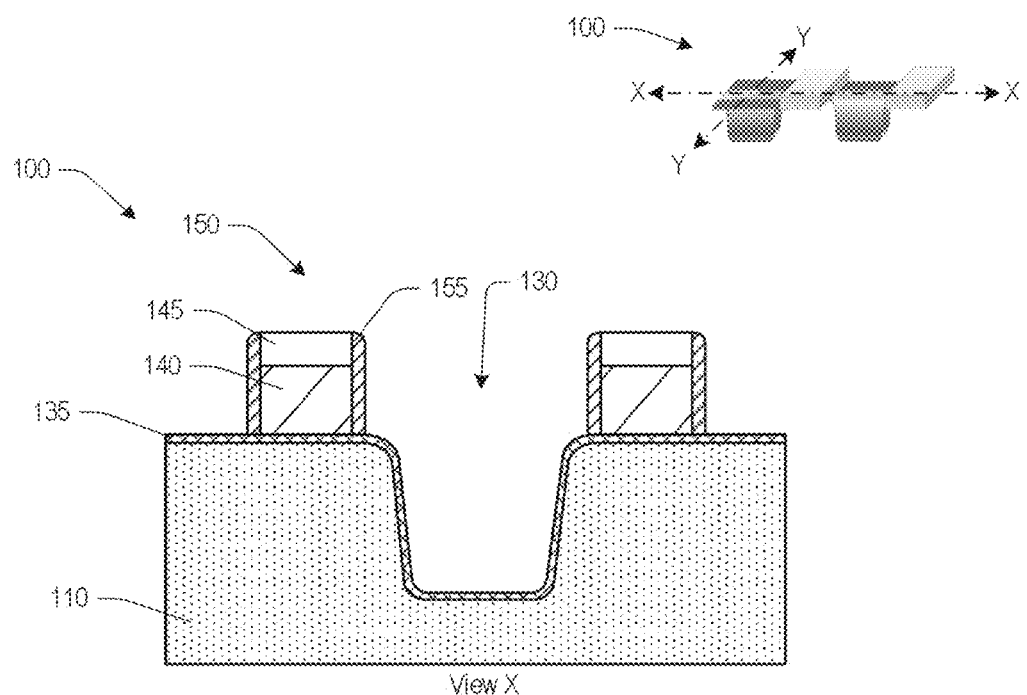

Referring to FIG. 5, a sidewall spacer 155 is formed adjacent the gate mask 145, the gate electrode layer 140, and the gate dielectric layer 135, and the portion 140P of the gate electrode layer 140 remaining in the recess 130 is removed, in accordance with some embodiments. In some embodiments, the sidewall spacer 155 is formed by depositing a conformal spacer layer over the gate mask 145, gate electrode layer 140, and the gate dielectric layer 135 and performing an anisotropic etch process to remove portions of the spacer layer positioned on horizontal surfaces of the gate mask 145, the semiconductor layer 110, and the STI structure 105. In some embodiments, the sidewall spacer 155 comprises the same material composition as the gate mask 145. In some embodiments, the sidewall spacer 155 comprises nitrogen, silicon and/or other suitable materials. Other structures and/or configurations of the sidewall spacer 155 are within the scope of the present disclosure.

Figure 6:
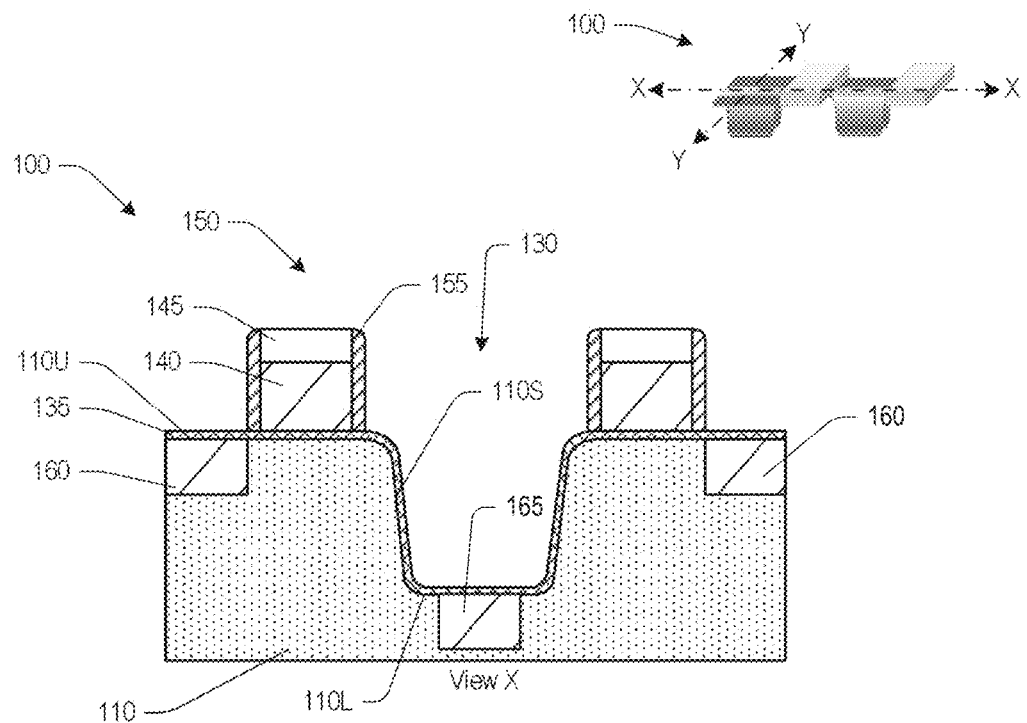

Referring to FIG. 6, source/drain regions 160 and a source/drain region 165 are formed in the semiconductor layer 110 adjacent the sidewall spacers 155, in accordance with some embodiments. In some embodiments, the source/drain regions 160 and the source/drain region 165 are formed by implantation of dopants, also referred to as impurities, into the semiconductor layer 110 using the sidewall spacer 155 and the gate mask 145 as an implantation template. In some embodiments, such as where a resulting transistor is an n-type DMOS device, the source/drain regions 160 and the source/drain region 165 comprise an n-type impurity, such as at least one of phosphorous, arsenic, or other suitable n-type dopants, and the active region 115 includes a p-type dopant, such as at least one of boron, BF2, or other suitable p-type dopants. In some embodiments, such as where a resulting transistor is a p-type DMOS device, the source/drain regions 160 and the source/drain region 165 comprise a p-type impurity, and the active region 115 includes an n-type dopant. In some embodiments, one or more implantation processes are performed to tailor the dopant profiles of the source/drain regions 160 and the source/drain region 165. For example, a tilted implantation using a dopant having a conductivity type opposite the conductivity type of the dopant in the source/drain regions 160 and the source/drain region 165 may be implanted under the sidewall spacer 155 to form halo regions, in accordance with some embodiments. In some embodiments, an implantation process is performed to form a lightly doped region under the sidewall spacers 155.

In some embodiments, the source/drain region 165 is formed under at least a lowermost surface 110L of the semiconductor layer 110 at the bottom of the recess 130. The source/drain region 165 may extend along a sidewall surface 110S of the semiconductor layer in the recess 130. In some embodiments, the source/drain region 160 extends laterally to abut at least a portion of the sidewall surface 110S. The widths of the source/drain region 160 and the source/drain region 165 relative to the gate structure 150 and the recess 130 may vary depending on the characteristics of the DMOS device to be formed. Other structures and/or configurations of the source/drain regions 160 and the source/drain region 165 are within the scope of the present disclosure.

Figure 7:
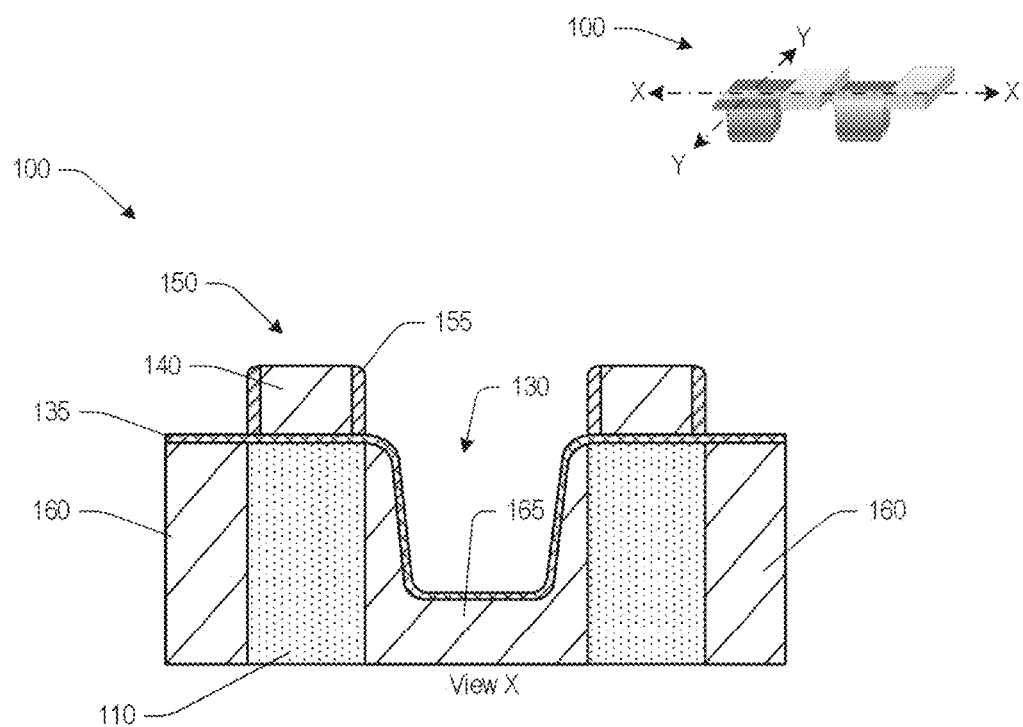

Referring to FIG. 7, the gate mask 145 is removed, in accordance with some embodiments. The gate mask 145 may be removed by forming a sacrificial layer, such as a sacrificial dielectric layer, in the recess 130 and over the gate structure 150 and the gate mask 145 and performing a planarizing process to remove portions of the sacrificial layer, the gate mask 145, and the sidewall spacer 155. After the planarization process, a selective etch process may be performed to remove the sacrificial layer.

Figure 8:
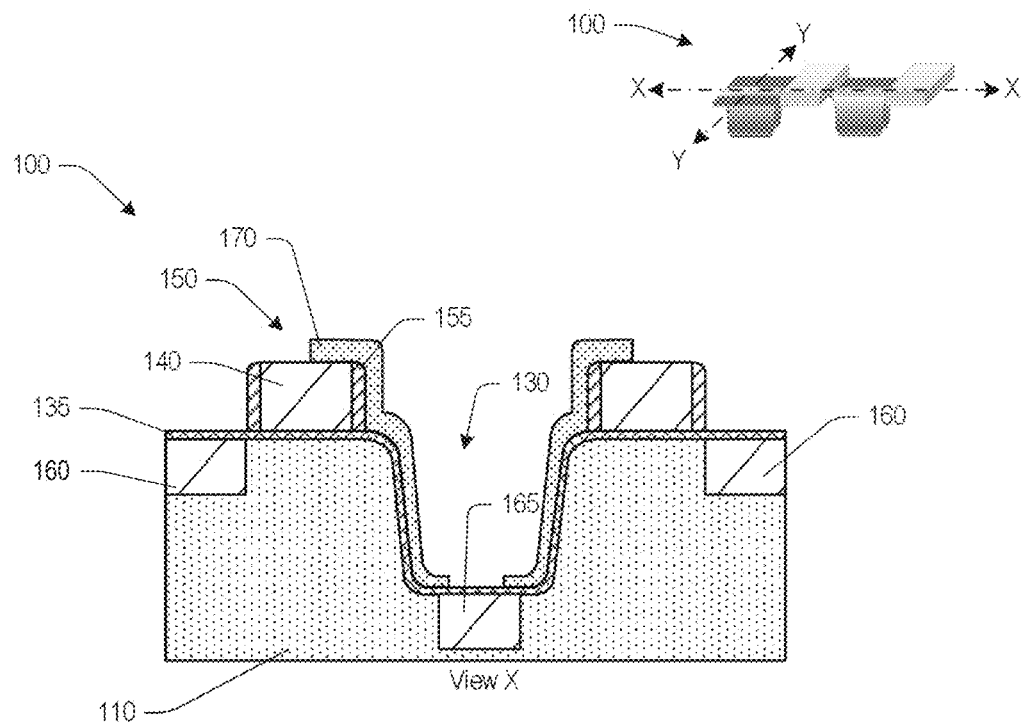

Referring to FIG. 8, a dielectric layer 170 is formed over a portion of the gate electrode layer 140 and in the recess 130 in accordance with some embodiments. In some embodiments, the dielectric layer 170 is formed by forming a conformal layer over the gate structure 150 and the gate dielectric layer 135 and performing a patterning process to remove portions of the dielectric layer 170 outside the recess 130, a portion of dielectric layer 170 over the gate electrode layer 140, and a portion of the dielectric layer 170 in the bottom of the recess 130 over the source/drain region 165. In some embodiments, the patterning process uses a photoresist mask. A plasma etch process is used to remove portions of the dielectric layer 170 not covered by the photoresist mask. In some embodiments, the dielectric layer 170 comprises a resist protective oxide (RPO) layer having a higher porosity than silicon dioxide. The plasma etch process for patterning the dielectric layer 170 may use a carbon fluoride ($C_4F_8$) etch gas.

Figure 9:
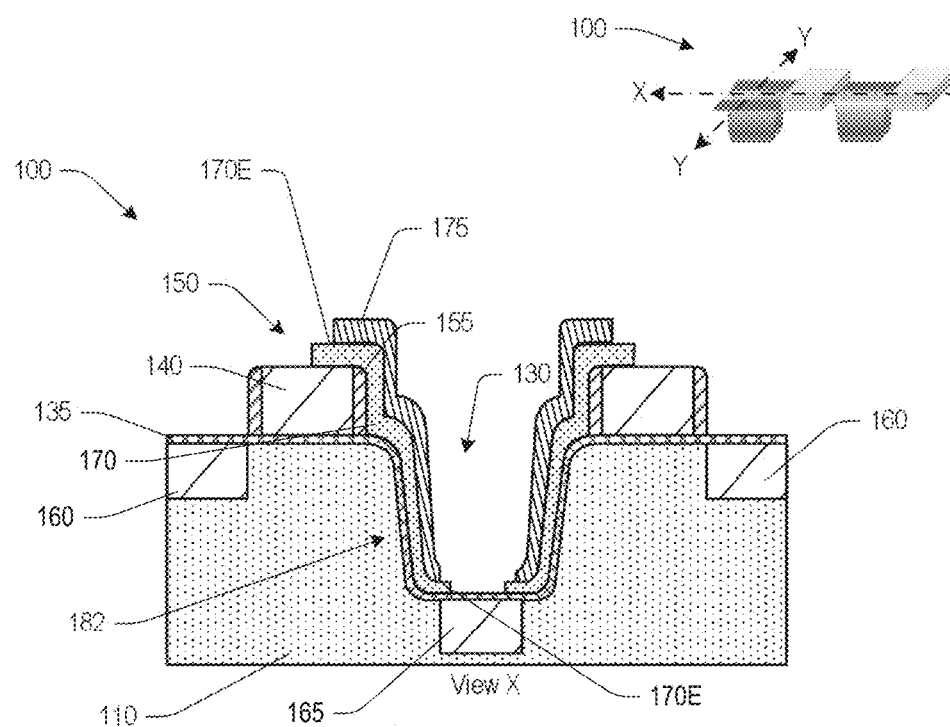

Referring to FIG. 9, a contact field plate 175 is formed over the gate structure 150, over the gate dielectric layer 135, over the dielectric layer 170, and in the recess 130 in accordance with some embodiments. In some embodiments, the contact field plate 175 is formed by forming a conformal conducive layer over the gate structure 150, the gate dielectric layer 135, and the dielectric layer 170 and performing a patterning process to remove portions of the conformal conductive layer not over the dielectric layer 170. A lateral margin is applied to the patterning process to remove portions of the contact field plate 175 over end portions 170E of the dielectric layer 170 to avoid forming a short between the contact field plate 175 and the gate electrode layer 140 or between the contact field plate 175 and the source/drain region 165. In some embodiments, the patterning process uses a photoresist mask. A plasma etch process is used to remove portions of the layer of material for the contact field plate 175 not covered by the photoresist mask. In some embodiments, the contact field plate 175 comprises titanium nitride (TiN). The plasma etch process for patterning the contact field plate 175 may use a hydrogen ($H_2$) etch gas.

The source/drain regions 160, the source/drain region 165, the gate structure 150, the dielectric layer 170, and the contact field plate 175 form DMOS devices 180A, 180B. A drift region 182 is formed between the gate structure 150 and the source/drain region 165. Applying a voltage to the contact field plate 175 via the conductive structure 200 allows a uniform electric field to be applied to the DMOS device 180A to maintain the breakdown voltage of the DMOS device 180A.

Figure 10:
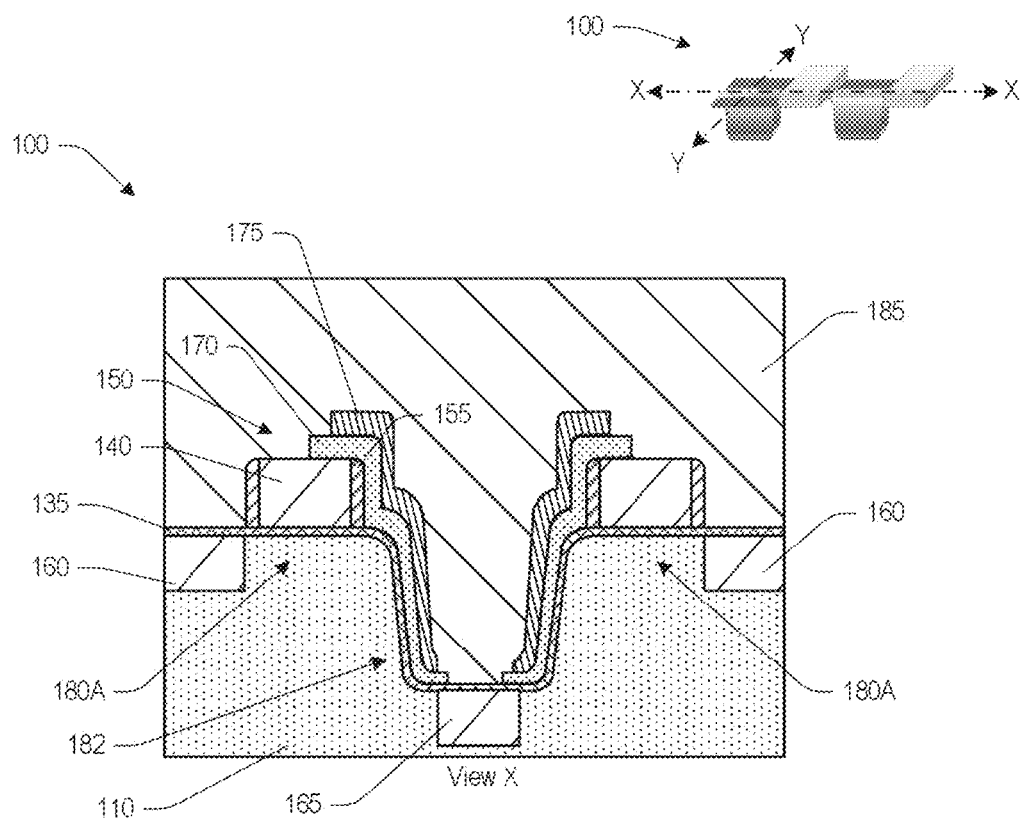

Referring to FIG. 10, an interlayer dielectric layer 185 is formed over the DMOS devices 180A, 180B, in accordance with some embodiments. The interlayer dielectric layer 185 comprises silicon dioxide, a low-k dielectric material, one or more layers of low-k dielectric material, and/or other suitable materials. Low-k dielectric materials have a k value lower than about 3.9. The materials for the interlayer dielectric layer 185 comprise at least one of Si, O, C, or H, such as carbon doped oxide dielectrics, SiCOH or SiOC, or other suitable materials. Organic material such as polymers may be used for the interlayer dielectric layer 185. The interlayer dielectric layer 185 may comprise at least one of a carbon-containing material, organo-silicate glass, a porogen-containing material, nitrogen, and/or or other suitable materials. The interlayer dielectric layer 185 may be formed by at least one of ALD, CVD, LPCVD, ALCVD, UHVCVD, RPCVD, PECVD, MBE, LPE, spin coating, spin-on technology, or other suitable techniques.

Figure 11:
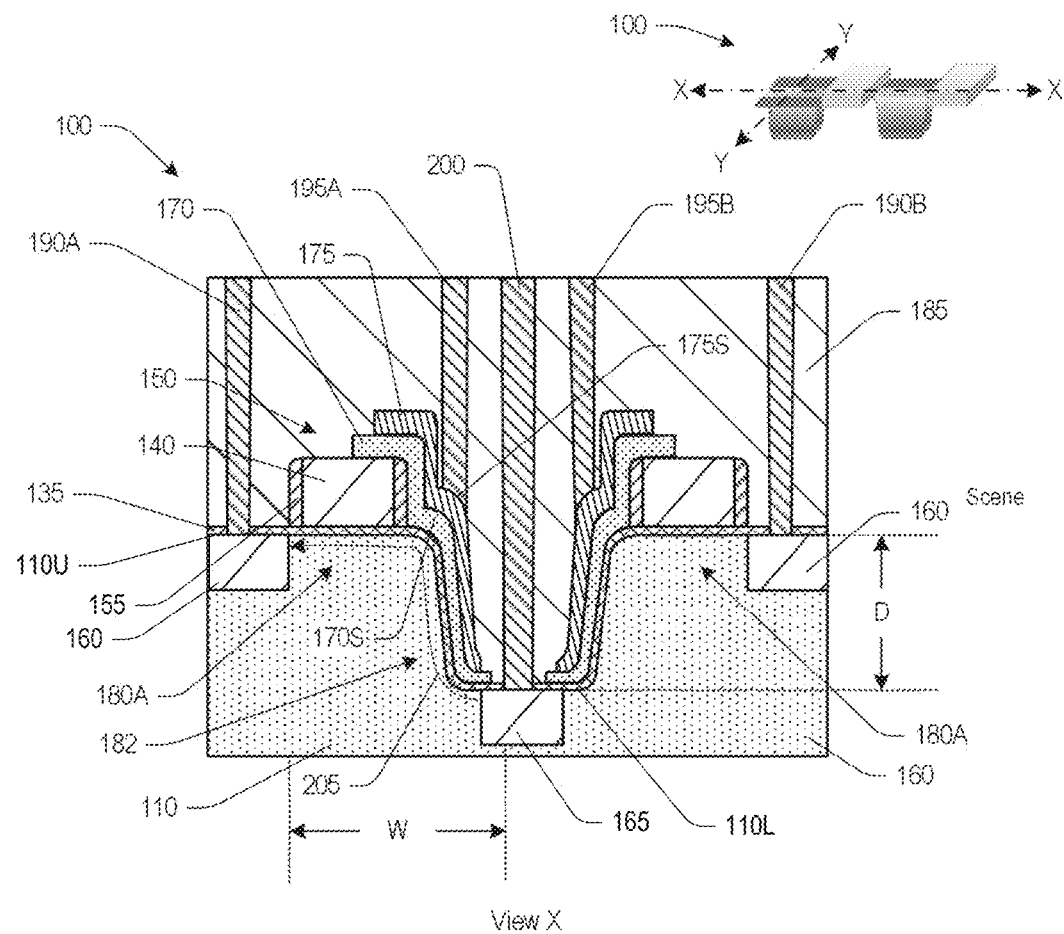

Referring to FIG. 11, conductive structures 190A, 190B, 195A, 195B, 200 are formed in the interlayer dielectric layer 185 to contact elements of the DMOS devices 180A, 180B, in accordance with some embodiments. The conductive structure 190A extends through the interlayer dielectric layer 185 and the gate dielectric layer 135 and contacts the source/drain region 160 of the DMOS device 180A. The conductive structure 190B extends through the interlayer dielectric layer 185 and the gate dielectric layer 135 and contacts the source/drain region 160 of the DMOS device 180B. The conductive structure 195A extends through the interlayer dielectric layer 185 and the gate dielectric layer 135 and contacts the contact field plate 175 of the DMOS device 180A. The conductive structure 195B extends through the interlayer dielectric layer 185 and contacts the contact field plate 175 of the DMOS device 180B. The conductive structure 200 extends through the interlayer dielectric layer 185 and the gate dielectric layer 135 and contacts the source/drain region 165. The source/drain region 165 is shared by the DMOS device 180A and the DMOS device 180B. The conductive structures 215 may be formed in any number of ways, such as by a single damascene process, a dual damascene process, a trench silicide process, and/or other suitable techniques. In some embodiments, a first patterning process is performed by etching the interlayer dielectric layer 185 in the presence of a first mask to define openings for the conductive structures 190A, 190B, 195A, 195B, and a second patterning process is performed by etching the interlayer dielectric layer 185 in the presence of a second mask to define openings for the conductive structure 200 due to the increased depth of the opening needed for the conductive structure 200. A conductive structure (not shown) for contacting gate electrode layer 140 of the gate structure 150 may be formed in a different position along the axial length of the gate structure 150, such as into or out of the page.

In some embodiments, the conductive structures 190A, 190B, 195A, 195B, 200 comprise a barrier layer, a seed layer, a metal fill layer, and/or other suitable layers. The metal fill layer comprises W, Al, Cu, Co, and/or other suitable materials. The conductive structures 190A, 190B, 195A, 195B, 200 may be formed by forming the layers of the conductive structures 190A, 190B, 195A, 195B, 200 in the openings and over the interlayer dielectric layer 185. A planarization process is performed to remove portions of the conductive structures 190A, 190B, 195A, 195B, 200 outside the openings and over the interlayer dielectric layer 185. Other structures and/or configurations of the conductive structures 190A, 190B, 195A, 195B, 200 are within the scope of the present disclosure.

In some embodiments, due to the underlying topography, the contact field plate 175 includes a shoulder region 175S over a shoulder region 170S of the dielectric layer 170. In some embodiments, the conductive structure 195A contacts the shoulder region 175S of the contact field plate 175.

The source/drain region 160 is formed under an uppermost surface 110U of the semiconductor layer 110, and the source/drain region 165 is formed under a lowermost surface 110L of the semiconductor layer 110. Forming the source/drain region 165 in the recess 130 allows the distance 205 between the source/drain region 160 and the source/drain region 165, represented by the dashed arrow, to be increased without increasing the lateral footprint of the DMOS device 180A. The distance 205 between the source/drain region 160 and the source/drain region 165 is determined in part by the depth, D, of the recess 130. In some embodiments, the depth, D, is between about 3000 Angstroms and 7000 Angstroms, such as about 5000 Angstroms. In an example where a distance between the source/drain region 160 and a top corner of the recess 130 is about 2500 Angstroms, a depth of the recess is about 5000 Angstroms, and a distance between a bottom corner of the recess 130 and the conductive structure 200 contacting the source/drain region 165 is about 2500 Angstroms, the distance 205 is about 1000 Angstroms but the cell width, W, is about 500 Angstroms, which allows the DMOS devices 180A, 180B to be formed with a density of about two times the density of a lateral DMOS device, where the cell width would be about 1000 Angstroms.

In some embodiments, a method of forming a semiconductor structure includes forming a recess in a semiconductor layer and forming a gate dielectric layer over the semiconductor layer and in the recess. A gate electrode is formed over the gate dielectric layer adjacent the recess. A first source/drain region is formed under an uppermost surface of the semiconductor layer adjacent the gate electrode. A second source/drain region is formed in the semiconductor layer under a lowermost surface of the semiconductor layer in the recess.

In some embodiments, a semiconductor structure includes a semiconductor layer comprising a first uppermost surface, a lowermost surface, and a first sidewall surface extending between the first uppermost surface and the lowermost surface. A gate dielectric layer is over the semiconductor layer. A first gate electrode is over a portion of the gate dielectric layer over the first uppermost surface of the semiconductor layer. A first source/drain region is in the semiconductor layer under the first uppermost surface and adjacent the first gate electrode. A second source/drain region is in the semiconductor layer under the lowermost surface of the semiconductor layer.

In some embodiments, a semiconductor structure includes a semiconductor layer, a gate dielectric layer over the semiconductor layer, a first gate electrode over a first portion of the gate dielectric layer, a first source/drain region in the semiconductor layer under a first surface of the semiconductor layer and adjacent the first gate electrode, and a second source/drain region in the semiconductor layer under a second surface of the semiconductor layer lower than the first surface.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is not limited thereto. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one or more of several implementations, such feature may be combined with one or more other features of the other implementations as may be desired and advantageous for any given or particular application.

What is claimed is:

1. A method of forming a semiconductor structure, comprising:
    forming a recess in a semiconductor layer;
    forming a gate dielectric layer over the semiconductor layer and in the recess;
    forming a gate electrode over the gate dielectric layer adjacent the recess;
    forming a first source/drain region under an uppermost surface of the semiconductor layer adjacent the gate electrode;
    forming a second source/drain region in the semiconductor layer under a lowermost surface of the semiconductor layer in the recess;
    forming a first dielectric layer over the gate dielectric layer and the gate electrode;
    forming a first conductive structure in the first dielectric layer contacting the first source/drain region; and
    forming a second conductive structure in the first dielectric layer contacting the second source/drain region.

2. The method of claim 1, comprising:
    forming a second dielectric layer over a first portion of the gate electrode and in the recess.

3. The method of claim 2, wherein forming the second dielectric layer comprises:
    forming the second dielectric layer over a portion of the semiconductor layer outside the recess, over the gate electrode, and over the semiconductor layer in the recess; and
    patterning the second dielectric layer to remove a first portion of the second dielectric layer over the portion of the semiconductor layer outside the recess, a second portion of the second dielectric layer over a second portion of the gate electrode, and a third portion of the second dielectric layer over the lowermost surface of the semiconductor layer in the recess.

4. The method of claim 2, comprising:
forming a contact field plate over a portion of the second dielectric layer.

5. The method of claim 4, wherein:
forming the contact field plate comprises:
  forming a conductive layer over the second dielectric layer, over a portion of the semiconductor layer outside the recess, over the gate electrode, and over the semiconductor layer in the recess; and
  patterning the conductive layer to remove portions of the conductive layer not over the second dielectric layer.

6. The method of claim 4, wherein:
forming the first dielectric layer comprises forming the first dielectric layer over the gate dielectric layer, the gate electrode, the second dielectric layer, and the contact field plate, and
the method comprises:
  forming a third conductive structure in the first dielectric layer contacting the contact field plate.

7. A semiconductor structure, comprising:
a semiconductor layer comprising a first uppermost surface, a lowermost surface, and a first sidewall surface extending between the first uppermost surface and the lowermost surface;
a gate dielectric layer over the semiconductor layer;
a first gate electrode over a first portion of the gate dielectric layer over the first uppermost surface of the semiconductor layer;
a first source/drain region in the semiconductor layer under the first uppermost surface and adjacent the first gate electrode;
a second source/drain region in the semiconductor layer under the lowermost surface of the semiconductor layer;
a first dielectric layer over a portion of the first gate electrode, the first sidewall surface of the semiconductor layer, and a portion of the lowermost surface of the semiconductor layer;
a first conductive structure in the first dielectric layer and contacting the first source/drain region; and
a second conductive structure in the first dielectric layer and contacting the second source/drain region.

8. The semiconductor structure of claim 7, comprising:
a second dielectric layer over the portion of the first gate electrode, the first sidewall surface of the semiconductor layer, and the portion of the lowermost surface of the semiconductor layer; and
a contact field plate over a portion of the second dielectric layer.

9. The semiconductor structure of claim 8, wherein end portions of the second dielectric layer are not covered by the contact field plate.

10. The semiconductor structure of claim 9, comprising:
a third conductive structure in the first dielectric layer contacting the contact field plate.

11. The semiconductor structure of claim 10, wherein:
the contact field plate forms a shoulder region, and
the third conductive structure contacts the shoulder region.

12. The semiconductor structure of claim 7, comprising:
a second gate electrode over a second portion of the gate dielectric layer over a second uppermost surface of the semiconductor layer; and
a third source/drain region in the semiconductor layer under the second uppermost surface and adjacent the second gate electrode, wherein the semiconductor layer comprises a second sidewall surface extending between the second uppermost surface and the lowermost surface.

13. The semiconductor structure of claim 12, wherein:
the first source/drain region, the first gate electrode, and the second source/drain region form a first device; and
the third source/drain region, the second gate electrode, and the second source/drain region form a second device.

14. A semiconductor structure, comprising:
a semiconductor layer;
a gate dielectric layer over the semiconductor layer;
a first gate electrode over a first portion of the gate dielectric layer;
a first source/drain region in the semiconductor layer under a first surface of the semiconductor layer and adjacent the first gate electrode;
a second source/drain region in the semiconductor layer under a second surface of the semiconductor layer lower than the first surface;
a first dielectric layer over a portion of the first gate electrode and the second source/drain region;
a contact field plate over a portion of the first dielectric layer;
a second dielectric layer over the gate dielectric layer, the first gate electrode, the first dielectric layer, and the contact field plate;
a first conductive structure in the second dielectric layer contacting the first source/drain region;
a second conductive structure in the second dielectric layer contacting the second source/drain region; and
a third conductive structure in the second dielectric layer contacting the contact field plate.

15. The semiconductor structure of claim 14, comprising:
a second gate electrode over a second portion of the gate dielectric layer; and
a third source/drain region in the semiconductor layer under a third surface of the semiconductor layer and adjacent the second gate electrode.

16. The semiconductor structure of claim 15, wherein:
the first source/drain region, the first gate electrode, and the second source/drain region form a first device; and
the third source/drain region, the second gate electrode, and the second source/drain region form a second device.

17. The semiconductor structure of claim 14, wherein a lowermost surface of the first source/drain region is above an uppermost surface of the second source/drain region.

18. The semiconductor structure of claim 14, wherein the second dielectric layer contacts the first dielectric layer and the contact field plate.

19. The semiconductor structure of claim 18, wherein the second dielectric layer further contacts the first gate electrode.

20. The semiconductor structure of claim 14, wherein the gate dielectric layer overlies the second source/drain region.

* * * * *